(12) United States Patent
Hunt et al.

(10) Patent No.: US 7,900,113 B2
(45) Date of Patent: Mar. 1, 2011

(54) DEBUG CIRCUIT AND A METHOD OF DEBUGGING

(75) Inventors: Peter Hunt, Bugbrooke (GB); Andrew J. Pickering, Rugby (GB); Tom Leslie, Clay Coton (GB)

(73) Assignee: Texas Instruments Incorporated, Dallas, TX (US)

( * ) Notice: Subject to any disclaimer, the term of this patent is extended or adjusted under 35 U.S.C. 154(b) by 405 days.

(21) Appl. No.: 12/028,440

(22) Filed: Feb. 8, 2008

(65) Prior Publication Data

US 2008/0215947 A1    Sep. 4, 2008

Related U.S. Application Data

(60) Provisional application No. 61/016,878, filed on Dec. 27, 2007.

(30) Foreign Application Priority Data

Feb. 9, 2007    (GB) .................... 0702597.6

(51) Int. Cl.
G01R 31/28    (2006.01)
G06F 11/00    (2006.01)
(52) U.S. Cl. .................... 714/744; 714/704
(58) Field of Classification Search .................... None
See application file for complete search history.

(56) References Cited

U.S. PATENT DOCUMENTS

| 5,128,673 | A | * | 7/1992 | Tamamura et al. | .......... 341/100 |
| 5,834,980 | A | * | 11/1998 | Pitio et al. | .................... 331/2 |
| 6,240,126 | B1 | * | 5/2001 | Ohashi et al. | .............. 375/132 |
| 6,563,888 | B1 | * | 5/2003 | Toriyama | .................... 375/340 |
| 6,806,762 | B2 | * | 10/2004 | Stair et al. | ................. 327/538 |
| 7,346,821 | B2 | * | 3/2008 | Whetsel | .................... 714/727 |
| 2003/0067975 | A1 | * | 4/2003 | Yamakura et al. | .......... 375/233 |
| 2004/0070433 | A1 | | 4/2004 | Adams et al. | |

FOREIGN PATENT DOCUMENTS

| EP | 0 942 533 A3 | 4/2004 |
| WO | WO 01/24008 A1 | 4/2001 |
| WO | WO 2007/132015 A | 11/2007 |

* cited by examiner

*Primary Examiner*—Cynthia Britt
*Assistant Examiner*—Guerrier Merant
(74) *Attorney, Agent, or Firm*—John R. Pessetto; W. James Brady; Frederick J. Telecky, Jr.

(57) ABSTRACT

A debug circuit for a multi-mode circuit driven by a clock signal, with an input for a clock signal, and a debug signal generator arranged to generate for each of a subset of the modes of the multi-mode circuit a corresponding debug signal based on a clock signal provided at the input. The frequency of debug signals is dependent on the frequency of a clock signal provided at the input, and each debug signal selects its respective mode for a length of time longer than that of each other mode of the multi-mode circuit, or each debug signal selects its respective mode for a length of time shorter than that of each other mode of the multi-mode circuit.

3 Claims, 8 Drawing Sheets

DEBUG CIRCUIT AND A METHOD OF DEBUGGING

This application claims priority under 35 U.S.C. 119(a) to GB Provisional Application No. 0702597.6 filed Feb. 9, 2007.

This application claims priority under 35 U.S.C. 119(e)(1) to U.S. Provisional Application No. 61/016,878 filed Dec. 27, 2007.

BACKGROUND OF THE INVENTION

1. Field of the Invention

This invention relates to a debug circuit for a multi-mode circuit driven by a clock signal, and a method of debugging a multi-mode circuit using such a debug circuit.

Figure 6:
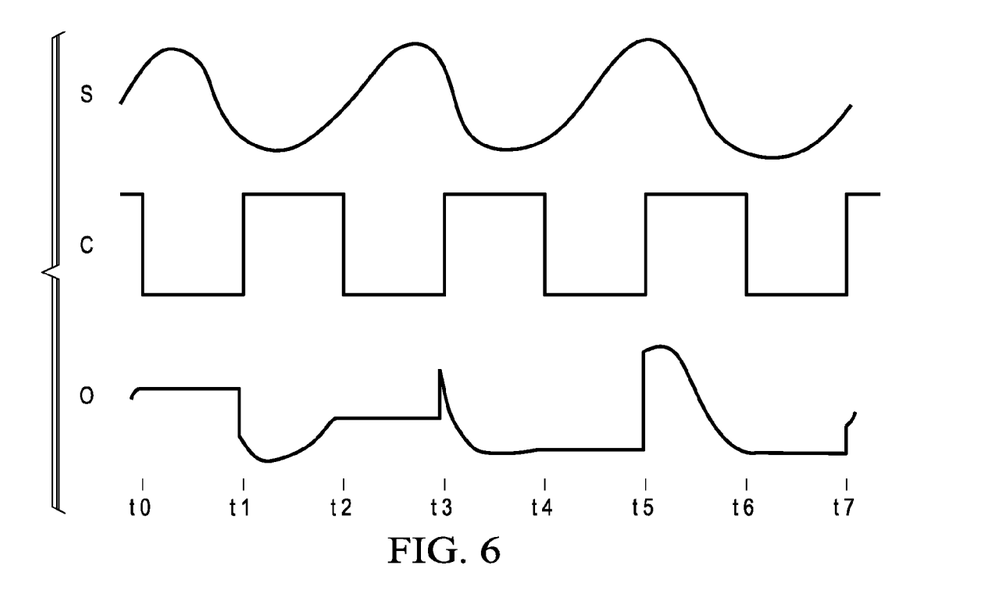
FIG. 6 is a waveform diagram for an ideal Track and Hold circuit.

Multi-mode circuits, such as for example Track and Hold, Acquire and Transfer, and Reset and Sample circuits, are commonly controlled by a clock signal. An example of the operation of a Track and Hold circuit is shown in FIG. 6. The circuit takes an input signal S and a clock signal C, and gives an output signal O. When the clock signal is in the high state, as for example between times t1 and t2, the output signal O of the circuit tracks the input signal S. When the clock signal switches to the low state, the output signal O holds at the level of the input signal S when the switch occurred. So for example between times t2 and t3 the output signal O is maintained at the level of the input signal at time t2. Such a circuit is used for example with an analogue-to-digital converter (ADC), which requires a steady input when it is performing the analogue-to-digital conversion.

Figure 7:
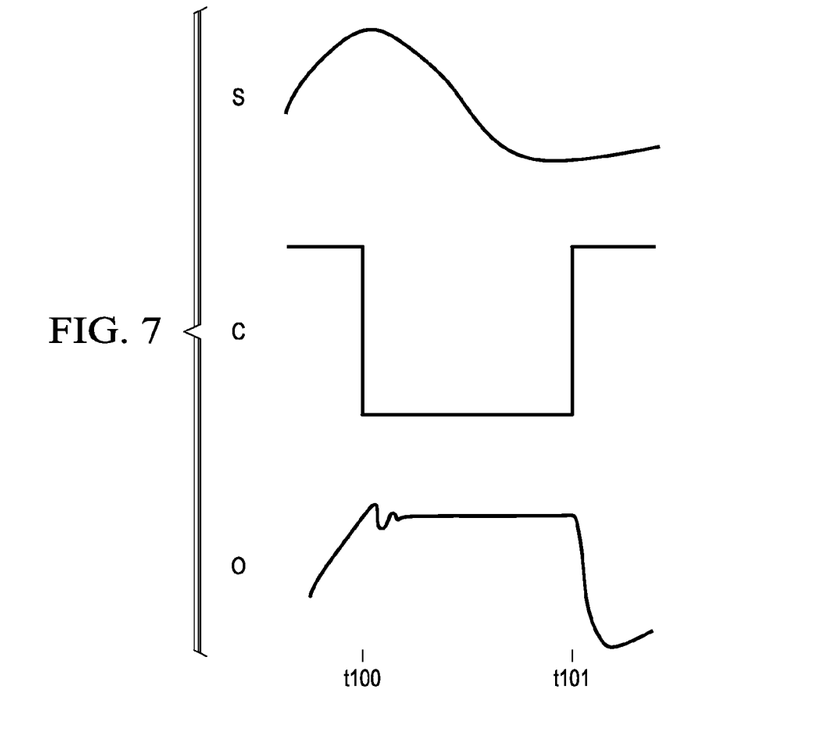
FIG. 7 is a waveform diagram showing the errors in an actual Track and Hold circuit.

The output signal O in FIG. 6 shows the ideal output of a Track and Hold circuit; however, in practice such an ideal signal will not be achievable. A Track and Hold circuit is prone to two main types of errors, which are shown in FIG. 7.

The first type of error is known as "hold mode settling". At time t100, when the clock signal C switches from the high state to the low state, the output signal O should be maintained at the level of the input signal S. As shown, however, the output signal O will in fact take a certain amount of time to settle onto the correct signal level. If the clock speed is high then the output signal may fluctuate for a large fraction of the duration of the Hold mode, which could for example prevent an ADC from making a correct conversion.

The second type of error is known as "imperfect acquisition". At time t101, when the clock signal C switches from the low state to the high state, the output signal O should move from the level it has been maintaining to the level of the input signal S, which it tracks. Ideally this movement would be instantaneous, but as shown the output signal O will in fact take a certain amount of time to reach and track input signal level S. If the output signal O has not yet begun to correctly track the input signal S when the clock signal C switches from the high state to the low state, then the level maintained during the next Hold mode will be incorrect.

At slow clock speeds these errors are unlikely to affect the operation of a circuit, but as clock speeds are increased one or other error is likely to become a problem. However, often the only available output will be that of a circuit as a whole, for example the output of an ADC. Although it can be seen that output errors occur, there is no indication as to whether the errors are caused by hold mode settling or imperfect acquisition.

2. Description of Related Art

A known solution to this problem is to include a circuit to allow the durations of the high and low states of the clock cycle to be continuously varied. If errors are occurring, the duration of (say) the low state can be increased while keeping the duration of the high state constant. If the output errors stop, then the errors must occur while the clock is in the low state, so in other words are most likely due to hold mode settling. If on the other hand the output errors remain when the duration of the low state is increased, but stop when the duration of the high state is increased, then the errors must occur while the clock is in the high state, so are most likely due to imperfect acquisition.

Although this solution is effective at identifying the mode in which errors occur, such a circuit to vary the clock state durations is complex to implement and requires a high component overhead. It is also applicable to only dual-mode circuits. A simple circuit that allowed debugging of multi-mode circuits would be advantageous.

SUMMARY OF THE INVENTION

According to the present invention there is provided a debug circuit for a multi-mode circuit driven by a clock signal, comprising: an input for a clock signal; a debug signal generator arranged to generate for each of a subset of the modes of the multi-mode circuit a corresponding debug signal based on a clock signal provided at the input; wherein the frequency of debug signals is dependent on the frequency of a clock signal provided at the input; and wherein each debug signal selects its respective mode for a length of time longer than that of each other mode of the multi-mode circuit, or each debug signal selects its respective mode for a length of time shorter than that of each other mode of the multi-mode circuit.

Advantageously, the debug signal generator comprises at least one flip-flop triggered by the input clock signal, arranged to provide a clock signal of a frequency lower than the input clock signal. Advantageously, a plurality of flip-flops triggered by the input clock signal are arranged to provide a respective plurality of lower-frequency clock signals. Preferably, the respective plurality of lower-frequency clock signals are out of phase. Advantageously, the clock signals provided by the flip-flops are combined to provide the debug signals.

Advantageously, the debug circuit is arranged to take an input clock signal that alternates between a first level and a second level, wherein the debug signal generator is arranged to provide a debug signal from the input clock signal by converting a proportion of periods when the input clock signal is at the first level to the second level. Alternate periods of the input clock signal at the first level may be converted to the second level.

Advantageously, the debug circuit is arranged to provide the debug signal for the respective mode of the subset of modes, or to provide the original input clock signal.

According to the present invention there is further provided a multi-mode circuit comprising a debug circuit as described above.

According to the present invention there is further provided a method of debugging a multi-mode circuit using a debug circuit as described above, comprising the steps of: 1) determining an error threshold for normal operation of the multi-mode circuit; 2) for each of the subset of modes of the multi-mode circuit: 2a) selecting the corresponding debug signal; 2b) selecting a clock frequency at which the error rate is less than the error threshold; 2c) increasing the clock frequency; 2d) recording the clock frequency at which the error rate rises above the error threshold; 3) comparing the recorded frequencies for each debug mode to determine the mode of the multi-mode circuit for which the error rate rises above the error threshold at the lowest frequency.

Each debug signal may selects select its respective mode for a length of time longer than that of each other mode of the multi-mode circuit, in which case the mode of the multi-mode circuit for which the error rate rises above the error threshold at the lowest frequency is determined to be the mode with the highest recorded frequency.

Each debug signal may selects its respective mode for a length of time shorter than that of each other mode of the multi-mode circuit, in which case the mode of the multi-mode circuit for which the error rate rises above the error threshold at the lowest frequency is determined to be the mode with the lowest recorded frequency.

BRIEF SUMMARY OF THE DRAWINGS

Examples of the invention will now be described with reference to the accompanying drawings, of which.

DETAILED DESCRIPTION OF THE PREFERRED EMBODIMENTS

A key challenge facing designers of high-bandwidth systems such as data-routers and super-computers is the requirement to transfer large amounts of data between ICs—either on the same circuit board or between boards. This data transmission application is called Serialisation-Deserialisation or "SerDes" for short. The present invention is useful in SerDes circuit and indeed was developed for that application. Nonetheless the invention may be used in other applications.

Analysis of typical backplane channel attenuation (which is around −24 dB) and package losses (−1 to −2 dB) in the presence of crosstalk predict that an un-equalized transceiver provides inadequate performance and that decision feedback equalization (DFE) is needed to achieve error rates of less than 10-17.

Traditional decision-feedback equalization (DFE) methods for SerDes receivers rely on either modifying, in analogue, the input signal based on the data history ["A 6.25 Gb/s Binary Adaptive DFE with First Post-Cursor tap Cancellation for Serial backplane Communications" R Payne et al ISSCC 2005; "A 6.4 Gb/s CMOS SerDes Core with feed-forward and Decision Feedback Equalization" M. Sorna et al ISSCC 2005; "A 4.8-6.4 Gb/s serial Link for Backplane Applications Using Decision Feedback Equalization" Balan et al IEEE JSSC November 2005.] or on having an adaptive analogue slicing level ["Techniques for High-Speed implementation of Non-linear cancellation" S. Kasturia IEEE Journal on selected areas in Communications. June 1991.] (i.e. the signal level at which the circuit decides whether the signal represents a 1 or a 0).

Figure 1:
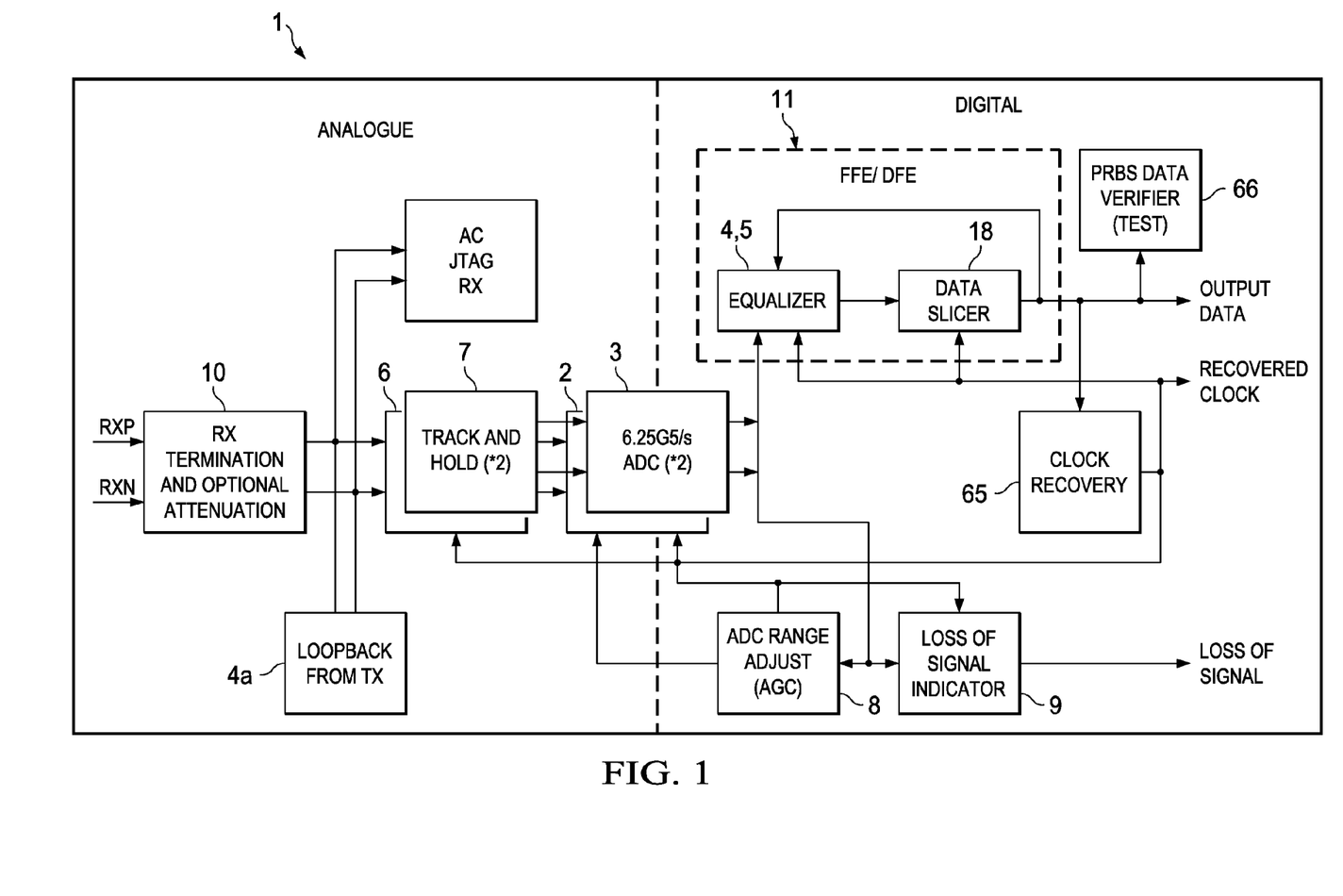
FIG. 1 is a block diagram a receiver circuit, in which the invention may be used.

A block diagram of a SerDes receiver circuit 1, which forms part of an integrated circuit, in which the present invention may be used is shown in FIG. 1. The invention may nonetheless be used in other applications.

In the receiver circuit 1 of FIG. 1 the input data is sampled at the baud-rate, digitized and the equalization and clock & data recovery (CDR) performed using numerical digital processing techniques. This approach results in the superior power/area scaling with process of digital circuitry compared to that of analogue, simplifies production testing, allows straightforward integration of a feed-forward equalizer and provides a flexible design with a configurable number of filter taps in the decision feedback equaliser. The circuit has been implemented in 65 nm CMOS, operating at a rate of 12.5 Gb/s.

The receiver circuit 1 comprises two baud-rate sampling ADCs (analogue to digital converters) 2 and 3, a digital 2-tap FFE (feed forward equaliser) 4 and digital 5-tap DFE (decision feedback equaliser) 5 to correct channel impairments.

The SerDes section of the integrated circuit, which includes the receiver circuit 1 is also provided with a transmitter 40 (FIG. 4), connected to transmit data over a parallel channel to that which the receiver circuit 1 is connected to receive data. The transmitter 40 comprises a 4-tap FIR filter to pre-compensate for channel impairments. In many applications the integrated circuit transmitting data to the receiver circuit 1 uses pre-compensation and in particular a similar transmitter circuit 40, but in other applications the receiver circuit 1 works without pre-compensation being used at the other end The receiver 1 of FIG. 1 is now described in more detail. The received data is digitized at the baud-rate, typically 1.0 to 12.5 Gb/s, using a pair of interleaved track and hold stages (T/H) 6 and 7 and a respective pair of 23 level (4.5 bit) full-flash ADCs 2 and 3 (i.e. they sample and convert alternate bits of the received analogue data waveform). The two track & hold circuits enable interleaving of the half-rate ADCs and reduce signal related aperture timing errors. The two ADCs, each running at 6.25 Gb/s for 12.5 Gb/s incoming data rate provide baud-rate quantization of the received data. The ADC's dynamic range is normalized to the full input amplitude using a 7-bit automatic gain control (AGC) circuit 8. A loss of signal indication is provided by loss of signal unit 9 that detects when the gain control signal provided by the AGC is out-of-range. An optional attenuator is included in the termination block 10, which receives the signals from the transmission channel, to enable reception of large signals whilst minimizing signal overload.

Figure 2:
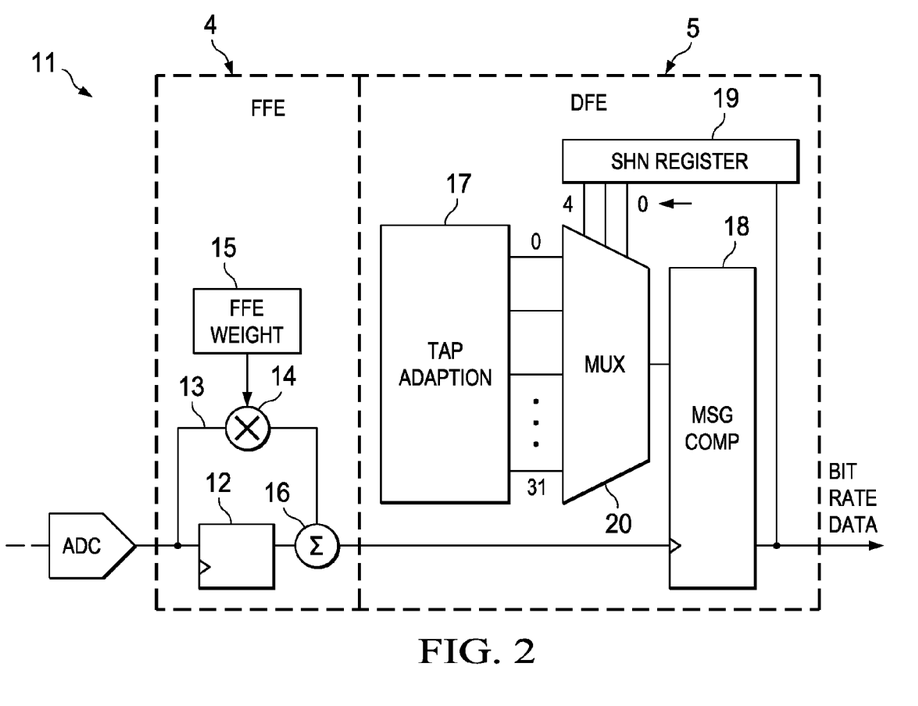
FIG. 2 shows the feed forward equaliser and the decision feedback equaliser of the receiver circuit of FIG. 1.

The digital samples output from the ADCs 2 and 3 are interleaved and the resulting stream of samples is fed into a custom digital signal processing (DSP) data-path that performs the numerical feed-forward equalization and decision-feedback equalization. This is shown in FIG. 2. This comprises a 1 UI delay register 12 connected to receive the stream of samples from the ADCs 2 and 3. (1 UI is a period of the clock, i.e. the delay between bits.) A tap 13 also feeds the samples from the ADCs to a multiplier 14, each sample being received by the delay latch 12 and the multiplier 14 at the same time. The multiplier 14 multiplies each sample by a constant weight value (held in a programmable register 15), which value is typically 10%. The outputs of the multiplier 14 and the delay register 12 are added together by an adder 16 to provide the output of the FFE 4.

The digital FFE/DFE is implemented using standard 65 nm library gates.

An advantage of applying the equalization digitally is that it is straightforward to include feed-forward equalization as a delay-and-add function without any noise-sensitive analogue delay elements. The FFE tap weight is selected before use to compensate for pre-cursor ISI and can be bypassed to reduce latency. Whilst many standards require pre-cursor de-emphasis at the transmitter, inclusion at the receiver allows improved bit error rate (BER) performance with existing legacy transmitters.

The DFE 5 uses an unrolled non-linear cancellation method ["Techniques for High-Speed implementation of Non-linear cancellation" S. Kasturia IEEE Journal on selected areas in Communications. June 1991]. The data output (i.e. the 1s and 0s originally transmitted) is the result of a magnitude comparison between the output of the FFE 4 and a slicer-level dynamically selected from a set stored in a set 17 of pre-programmed registers. The values are determined by a control circuit (not shown in FIG. 1) from the waveforms of test patterns sent during a setup phase of operation. The magnitude comparison is performed by a magnitude comparator 18 connected to receive the output of the FFE 4 and the selected slicer-level; it outputs a 1 if the former is higher than the latter and a 0 if it is lower or equal, thereby forming the output of the DFE 5.

The slicer-level is selected from one of 2 n possible options depending on the previous n bits of data history. The history of the bits produced by the magnitude comparator 18 is recorded by a shift register 19 which is connected to shift them in. The parallel output of the shift register is connected to the select input of a multiplexer 20 whose data inputs are connected to the outputs of respective ones of the set 17 of registers holding the possible slicer-levels.

Unrolled tap adaption is performed using a least mean square (LMS) method where the optimum slicing level is defined to be the average of the two possible symbol amplitudes (+/−1) when proceeded by identical history bits. (For symmetry the symbols on the channel for the bit values 1 and 0 are given the values +1 and −1).

Although 5-taps of DFE were chosen for this implementation, this parameter is easily scaleable and performance can be traded-off against power consumption and die area. In addition, the digital equalizer is testable using standard ATPG (automatic test pattern generation) and circular built-in-self-test approaches.

Figure 3:
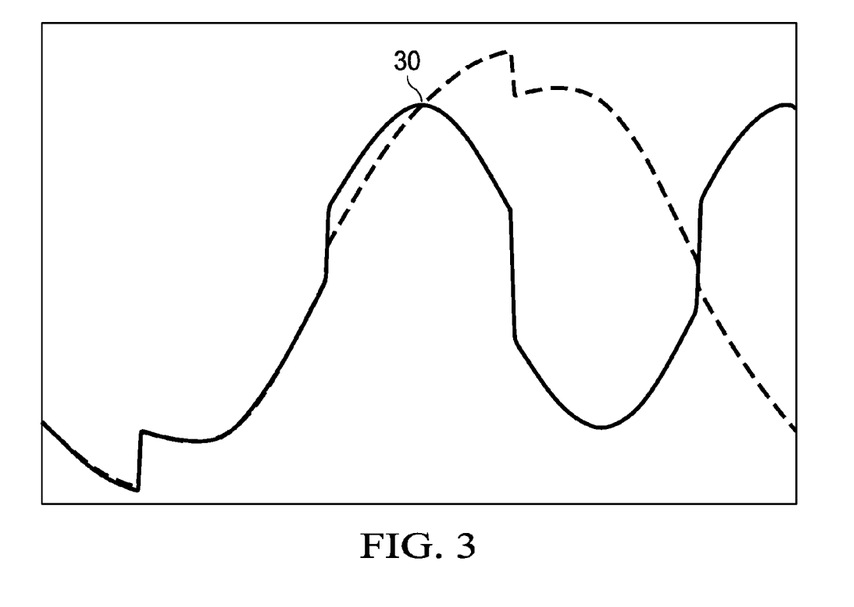
FIG. 3 is a graph showing the post equalised signal amplitude for exemplary bit patterns.

The chosen clock recovery approach uses a Muller-Mueller approach ["Timing recovery in Digital Synchronous Data Receivers" Mueller and Muller IEEE Transactions on Communications May 1976.] where the timing function adapts the T/H sample position to the point where the calculated pre-cursor inter-symbol interference (ISI) or h(−1) is zero, an example being given in FIG. 3. The two curves show the post-equalized response for 010 and 011 data sequences respectively. The intersection 30 at 3440 ps occurs when the sample of the second bit is independent of the third bit—that is, h(−1)=0. This position can be detected by comparing the post-equalized symbol amplitude with the theoretical amplitude h(0) and using the difference to update the CDR's phase-interpolator.

Figure 4:
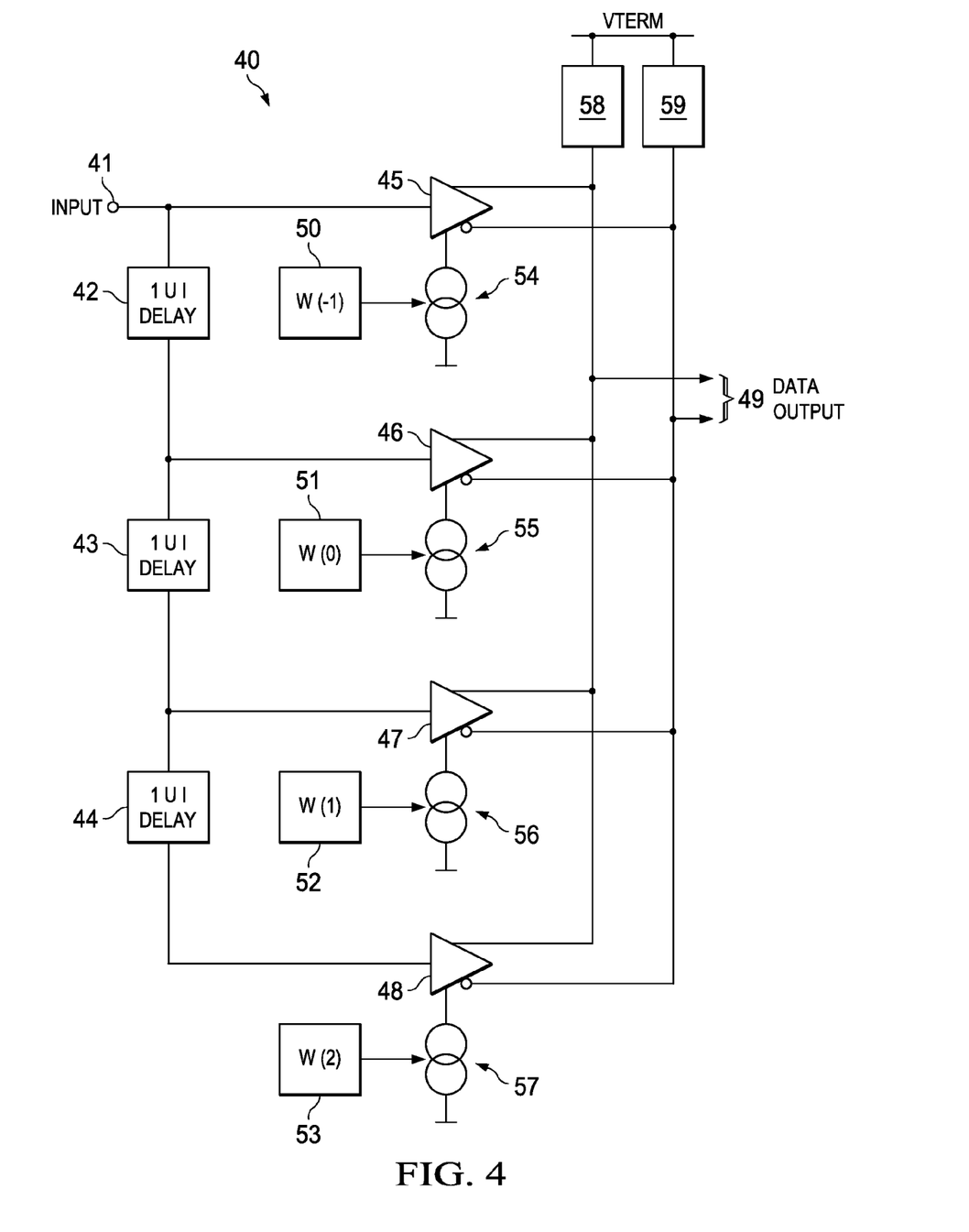
FIG. 4 is a diagram of a transmitter.

A block diagram of the transmitter is shown in FIG. 4, which is implemented using CML techniques. The data to be transmitted (received at terminal 41) is sequentially delayed by three 1 UI delay registers 42, 43 and 44 connected in series. They produce, via the four taps before and after each delay, a nibble-wide word containing the pre-cursor, cursor and two post-cursor components. In fact to ease timing closure the data is sent to the transmitter from the digital part of the circuit that supplies the data in blocks of 4 nibbles (16 bits in parallel), the blocks being sent at a rate of 3.125/s. Each nibble is a frame of four bits of the bitstream offset by one bit from the next so the nibbles overlap and represent the data redundantly. A multiplexer then selects one of the nibbles, switching between them at a rate of 12.5×109/s, and presents that in parallel to the four taps, thereby making the bitstream appear to advance along the taps.

A 4-tap FIR output waveform is obtained from simple current summing of the time-delayed contributions. This is done with differential amplifiers 45 to 48, each having its inputs connected to a respective one of the taps and having its differential output connected to a common differential output 49. Although shown as four differential amplifiers the circuit is implemented as one differential amplifier with four inputs, which minimizes return-loss. The relative amplitude of each contribution is weighted to allow the FIR coefficients to be optimized for a given circuit (e.g. a backplane) and minimize the overall residual ISI. The weights are determined empirically either for a typical example of a particular backplane or once a backplane is populated and are stored in registers 50 to 53. The weights respectively control the controllable driving current sources 54 to 57 of the differential amplifiers 45 to 48 to scale their output current accordingly. Respective pull-up resistors 58 and 59 are connected to the two terminals of the differential output 49.

A PLL is used to generate low-jitter reference clocks for the transmitter and receiver to meet standards ["OIF-CEI-02.0—Common Electrical I/O (CEI)—Electrical and Jitter Interoperability agreements for 6 G+bps and 11 G+bps I/O". Optical Internetworking Forum, February 2005; "IEEE Draft 802.3ap/Draft 3.0—Amendment: Electrical Ethernet Operation over Electrical Backplanes" IEEE July 2006.]. Most integrated circuits will have more than one receiver 1 and the PLL is shared between them with each receiver having a phase interpolator to set the phase to that of incoming data.

The PLL uses a ring oscillator to produce four clock-phases at a quarter of the line data-rate. The lower speed clocks allow power efficient clock distribution using CMOS logic levels, but need duty-cycle and quadrature correction at the point of use. The 3.125 GHz clocks are frequency doubled (XOR function) to provide the 6.25 GHz clock for the T/H & ADC. The transmitter uses the four separate 3.125 GHz phases, but they require accurate alignment to meet jitter specifications of 0.15UI p-p R.J. and 0.15UI p-p D.J.

The system described has been fabricated using a 65 nm CMOS process and has been shown to provide error-free operation at 12.5 Gb/s over short channels (two 11 mm package traces, 30 cm low-loss PCB and two connectors). A legacy channel with −24 dB of attenuation at 3.75 GHz supports error free operation at 7.5 Gb/s.

Figure 5A:
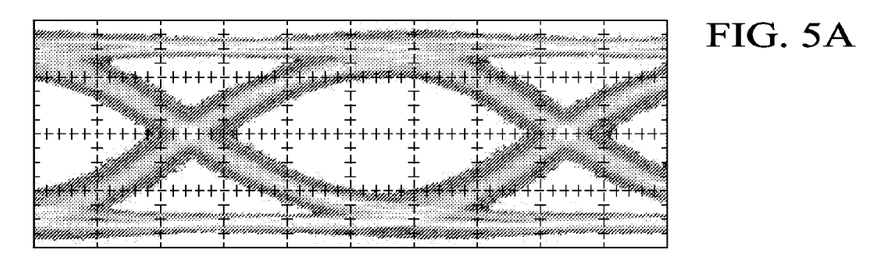
FIG. 5a shows the response of the receiver to a PRBS transmitted eye-pattern.
Figure 5B:
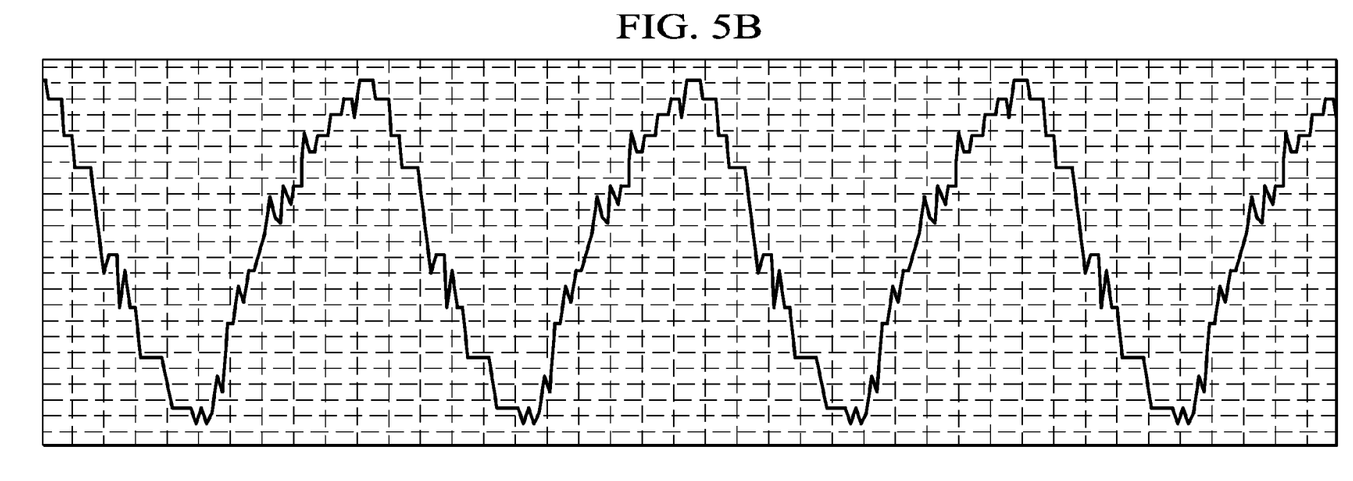
FIG. 5b shows the interleaved output of the ADCs of the receiver.

FIG. 5a shows a 12.5 Gb/s 2⁷-1 pseudo random bit stream (PRBS) transmitted eye-pattern with 20% de-emphasis on the first post-cursor. The receiver includes, for test purposes, a PRBS data verifier 66, which confirms that the test pattern has been received. The differential peak-to-peak (pp) amplitude is 700 mV (200 mV/div). FIG. 5b shows the ADC output when a 6.25 GHz sine-wave is sampled and the phase between the sine-wave and receiver is incremented using a programmable delay-line. The measured codes are within +/−1 lsb (least significant bit) of the expected values. This level of performance ensures robust operation over a wide range of cables, green-field and legacy channels. The worst-case power of a single TX/RX pair, or "lane" is 330 mW and the total exemplary macro area is 0.45 mm2 per lane (allowing for the PLL being shared by four TX/RX lanes.

Figure 8:
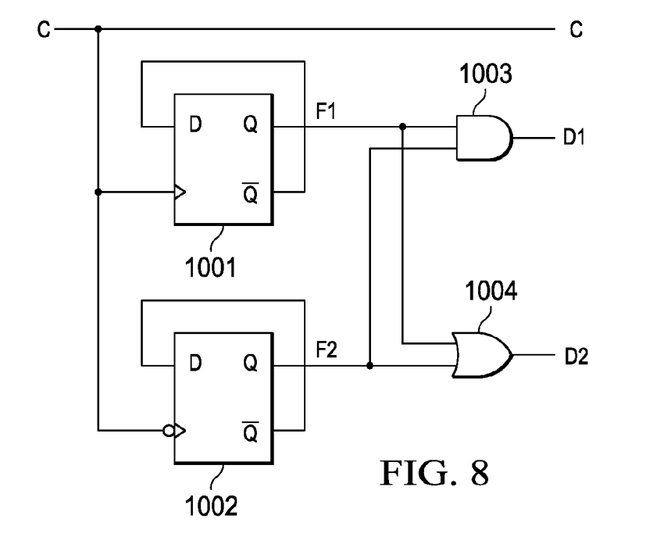
FIG. 8 is a first example of a debug signal generator circuit according to the present invention.

A first example of a circuit according to the present invention is shown in FIG. 8. This circuit takes as input a clock signal C, and provides first and second debug signals D1 and D2. When used for example in a Track and Hold circuit used in an ADC, the clock signal, debug signal D1 or debug signal D2 would be selected by means of a multiplexer.

The circuit comprises two D-type flip-flops 1001 and 1002. The clock signal C is input to the edge trigger of flip-flop 1001, and the complement of the clock signal C is input to the edge trigger of flip-flop 1002. Each flip-flop has its complemented output Qbar connected to its respective D input. The outputs of the flip-flops 1001 and 1002 are input to an AND gate 1003, the output of which gives a first debug signal D1. The outputs of the flip-flops 1001 and 1002 are also input to an OR gate, the output of which gives a second debug signal D2.

Figure 9:
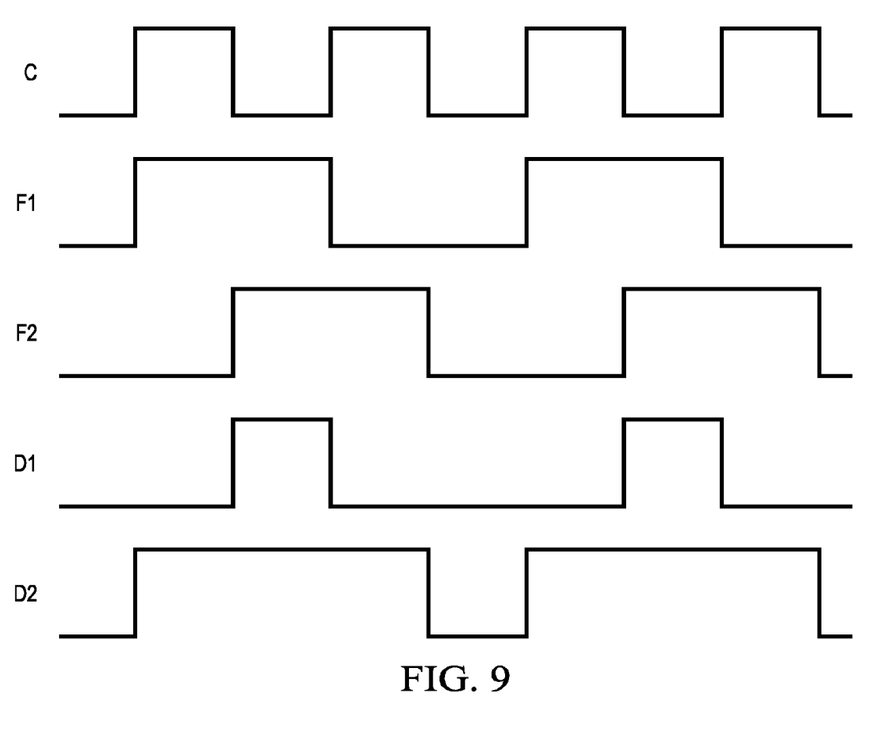
FIG. 9 is a waveform diagram for the circuit of FIG. 8.

The signals in the circuit of FIG. 8 are shown in FIG. 9. The output F1 of the flip-flop 1001 is the clock signal C at half frequency, as the flip-flop is toggled by each high pulse of the clock signal C. Similarly, the output F2 of the flip-flop 1002 is also the clock signal C at half frequency, but in this case as the clock signal C is complemented the flip-flop is triggered on each low pulse of the clock signal C, and so the output F2 is 90 degrees out of phase from the output F1.

The debug signal D1 is produced by AND-ing the two output signals F1 and F2, giving a signal which is high for a single clock pulse and low for 3 clock pulses, in other words it has a high:low ratio of 1:3. The debug signal D2 is produced by OR-ing the two output signals F1 and F2, giving a signal which is high for three clock pulses and low for a single clock pulse, in other words it has a high:low ratio of 3:1.

Although in the example of FIG. 8 the clock signal C is simply passed through the circuit, it may be desirable instead to recover the clock signal C from the flip-flop output signals F1 and F2, which can be done by exclusive OR-ing the signals.

In usual operation in, for example, an ADC circuit incorporating a Track and Hold circuit, the clock signal C is selected. When debugging the ADC circuit, first one of the debug signals, say D1, is selected. Starting at a frequency at which there are no errors in the output of the ADC, the frequency of the clock signal C is increased until errors begin to occur. (In fact the beginning frequency will be a frequency for which the number of errors is less than a certain threshold, as for all circuits errors will occur that are not due to the modes failing at high frequency, but occur for other reasons, for example because of noise on the input.) The frequency A1 at which the errors begin to occur is then recorded. The other debug signal, in this case D2, is then selected. Again starting at a frequency at which there are no errors in the output of the ADC, the frequency of the clock signal C is increased until errors begin to occur. This frequency A2 is recorded.

In the first case, where frequency A1 is recorded, the debug signal consists of a high state for a single clock pulse and a low state for 3 clock pulses. In this case then the Track mode has only the duration of a single clock pulse in which to operate, while the Hold mode has the duration of 3 clock pulses in which to operate. In the second case, where the frequency A2 is recorded, the situation is reversed, with the Hold mode having only the duration of a single clock pulse in which to operate, and the Track mode has the duration of 3 clock pulses in which to operate.

Suppose that frequency A1 is less than the frequency A2. When debug signal D1 is used, errors begin to occur when the Track mode has only a single clock pulse, of duration 1/A1, in which to operate. At this same point, the Hold mode has a duration of 3/A1 in which to operate. The errors must therefore be due to the Track mode. (This must be the case, for the following reason. Suppose the errors were due to the Hold mode. In that case, they would be occurring when the Hold mode had a duration of 3/A1 in which to operate. When signal D2 is used, the duration of the Hold mode is 1/A2; therefore errors would occur when A2 was equal to A1/3. But we know that A2 is greater than A1, so that cannot be the case.)

By a similar argument, if frequency A1 is greater than A2, the errors must be due to the Hold mode.

Although the circuit of FIG. 8 provides debug signals with a high:low ratio of 1:3 and 3:1, it will be appreciated that debug signals using other high:low ratios are equally suited to the invention. A circuit providing debug signals with high:low ratios of 1:2 and 2:1 is shown in FIG. 10.

The circuit comprises two D-type flip-flops 1010 and 1011 and an OR gate 1012. The clock signal C is connected to the edge-triggers of the flip-flops 1010 and 1011. The complemented output Qbar of the flip-flop 1010 is connected to its D input, and to an input of the OR gate 1012. The complemented output Qbar of the flip-flop 1011 is connected to the other input of the OR gate 1012, and the output of the OR gate is connected to the D input of the flip-flop 1012. The output Q and Qbar of the flip-flop 1011 provide the first and second debug signals D1 and D2 respectively.

Figure 10:
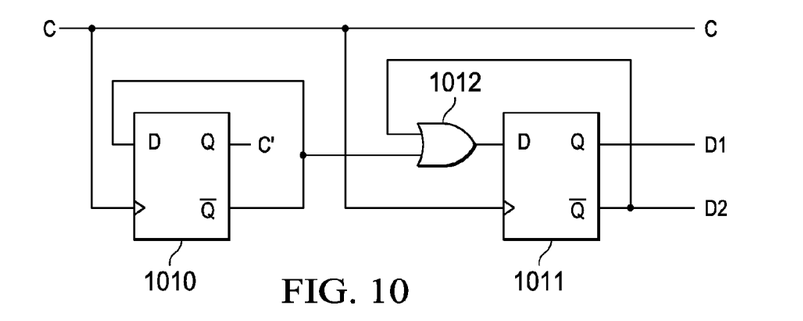
FIG. 10 is a second example of a debug signal generator circuit according to the present invention.
Figure 11:
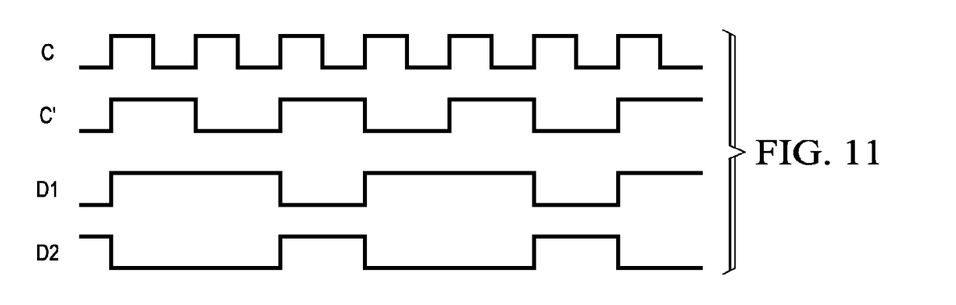
FIG. 11 is a waveform diagram for the circuit of FIG. 10.

The signals of the circuit of FIG. 10 are shown in FIG. 11. As can be seen, the debug signal is high for four consecutive clock pulses and low for two consecutive clock pulses, giving a high:low ration of 2:1. The signal D2, which is simply the complement of D1, is therefore low for four consecutive clock pulses and high for two consecutive clock pulses, giving a high:low ration of 1:2. These debug signals can thus be used with the method described above to debug a circuit.

Although in the examples described the two debug signals have had corresponding high:low ratios, it will be appreciated that debug signals without corresponding ratios could also be used, for example a first debug signal with a high:low ratio of 1:3 and a second debug signal with a high:low ratio of 2:1.

Figure 12:
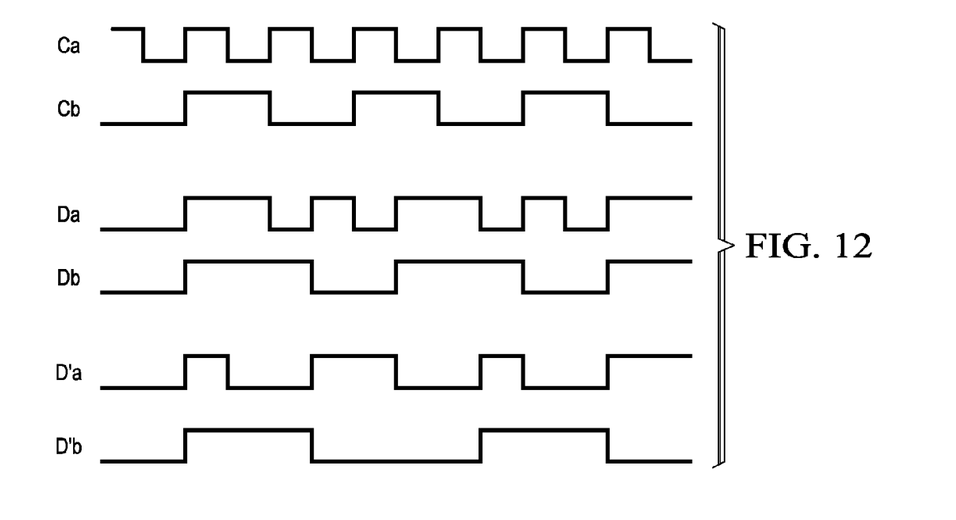
FIG. 12 is a waveform diagram for debug signals for a four-mode circuit.

Although in the examples described above the circuit to be debugged has been a dual mode Track and Hold circuit, the invention is equally applicable to other dual mode circuits, and indeed any circuit with a number of modes that is driven by a clock. For example, a four mode circuit requires four debug signals, each of which has maintains three of the modes for the same duration and one mode for a shorter or longer duration. (The method of debugging works equally in either case.) If, for example, the four mode circuit was driven by a clock that provides a 1-bit clock signal Ca and a 2-bit clock signal Cb as shown in FIG. 12, one debug mode could use debug signals Da and Db, in which the first mode is maintained for two bits, and the other three modes for one bit. In other words, the ratio of modes is 2:1:1:1. (The further three debug modes would maintain for two bits the other three modes respectively in a similar way, giving ratios of 1:2:1:1, 1:1:2:1 and 1:1:1:2.) When using these debug modes to debug a circuit, again the frequencies at which errors begin to occur for each debug mode are recorded. By a similar argument to above, it can be seen that the 2-bit mode in the debug state in which the frequency is highest is the mode which is causing the errors.

Alternatively, one debug mode could use debug signals D'a and D'b, in which the first mode is maintained for one bit and the other three modes for two bits, giving a ratio of modes of 1:2:2:2. (The further three debug modes would have mode ratios of 2:1:2:2, 2:2:1:2 and 2:2:2:1.) In this case it can be seen that the 1-bit mode in the debug mode at which the frequency was lowest is the mode which is causing the errors.

It will also be appreciated that although in the four mode example given above, in each debug mode three modes are of equal length, all that is in fact required is that each debug mode maintains one respective circuit mode for a longer time than the other three states. (For example the four mode ratios could be 5:1:2:3, 3:6:2:4, 4:3:7:1, 3:3:3:5.) Alternatively, each debug mode could maintain one respective circuit mode for a shorter time than the other three states. (For example the four mode ratios could be 1:4:2:2, 3:2:4:5, 5:4:1:3, 3:3:3:1.)

Figure 13:
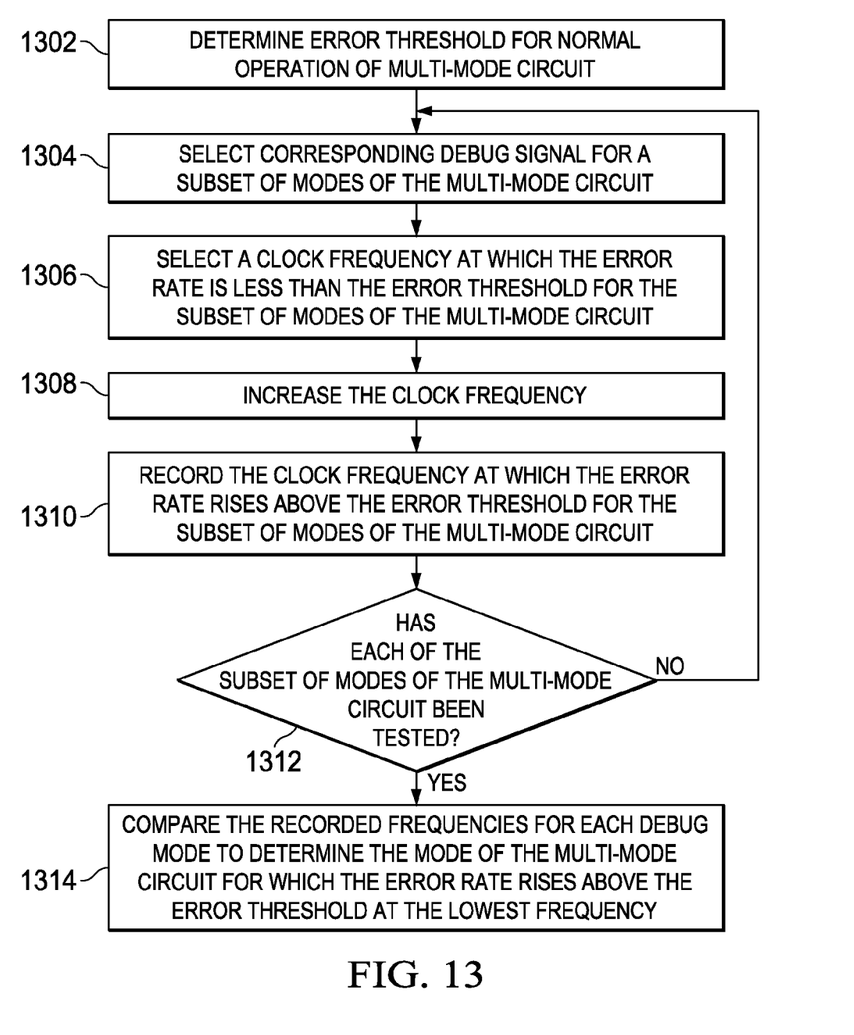
FIG. 13 is a flow chart of an embodiment of a method of debugging a multimode circuit.

FIG. 13 is a flow chart of an embodiment of a method of debugging a multimode circuit. Box 1302 illustrates a first step in a method of debugging a multimode circuit. In this embodiment, during the first step an error threshold for normal operation of a multi-mode circuit is determined. Box 1304 illustrates a second step in a method of debugging a multimode circuit. In this embodiment, during the second step, a debug signal is selected for a subset of modes of the multi-mode circuit. Box 1306 illustrates a third step in a method of debugging a multimode circuit. In this embodiment, during the third step, as clock frequency is selected wherein the error rate is less than the error threshold.

At step 1308, in this example of a method of debugging a multimode circuit, the clock frequency is increased. The clock frequency is increased during step 1310 until the error rate rises above the error threshold for the subset of modes of the multi-mode circuit. After step 1310, step 1312 determines when all of the modes of the multi-mode circuit have been tested.

When all of the modes of the multi-mode circuit have been tested, the method continues with step 1314. When all of the modes of the multi-mode circuit have not been tested, the method returns to step 1304 to select a corresponding debug signal for another subset of modes of the multi-mode circuit. In this embodiment, during step 1314, the recorded frequencies for each debug mode are compared to the mode of the multi-mode circuit for which the error rate rises above the error threshold at the lowest frequency.

It will also be appreciated that if it is known that errors are being caused by one of a subset of the modes of a multi mode circuit (in other words there are one or more modes which it is known are not causing the errors), then the circuit can be debugged using only debug modes for that subset of modes.

What is claimed is:

1. A method of debugging a multi-mode circuit using a debug comprising the steps of:
    1) determining an error threshold for normal operation of the multi-mode circuit;
    2) for each of a subset of modes of the multi-mode circuit:
        2a) selecting the corresponding debug signal;
        2b) selecting a clock frequency at which an error rate is less than the error threshold;
        2c) increasing the clock frequency;
        2d) recording the clock frequency at which the error rate rises above the error threshold;
    3) comparing the recorded frequencies for each debug mode to determine the mode of the multi-mode circuit for which the error rate rises above the error threshold at the lowest frequency.

2. A method as claimed in claim 1, wherein each debug signal selects its respective mode for a length of time longer than that of each other mode of the multi-mode circuit, and the mode of the multi-mode circuit for which the error rate rises above the error threshold at the lowest frequency is determined to be the mode with the highest recorded frequency.

3. A method as claimed in claim 1, wherein each debug signal selects its respective mode for a length of time shorter than that of each other mode of the multi-mode circuit, and the mode of the multi-mode circuit for which the error rate rises above the error threshold at the lowest frequency is determined to be the mode with the lowest recorded frequency.

* * * * *